(12) United States Patent
Itou

(10) Patent No.: US 6,333,530 B1
(45) Date of Patent: Dec. 25, 2001

(54) SEMICONDUCTOR MEMORY DEVICE HAVING REDUNDANCY FUNCTION

(75) Inventor: Takashi Itou, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/480,944

(22) Filed: Jan. 11, 2000

(30) Foreign Application Priority Data

Jul. 16, 1999 (JP) .................................................. 11-202844

(51) Int. Cl.[7] .......................... H01L 27/108; H01L 29/76; H01L 29/94; H01L 31/119
(52) U.S. Cl. ........................... 257/296; 257/907; 257/908
(58) Field of Search .................................. 257/295–310, 257/907–908; 361/51; 365/200, 201; 438/243–253, 396–399

(56) References Cited

U.S. PATENT DOCUMENTS 5,617,364 * 4/1997 Hatakeyama ......................... 365/200
5,715,202 * 2/1998 Harima ................................. 365/200
6,230,292 * 5/2001 Duesman et al. .................... 365/201

FOREIGN PATENT DOCUMENTS 60-151895  8/1985  (JP) .
8-153859  6/1996  (JP) .

\* cited by examiner

Primary Examiner—Tom Thomas
Assistant Examiner—Cuong Quang Nguyen
(74) Attorney, Agent, or Firm—McDermott, Will & Emery

(57) ABSTRACT

The semiconductor memory device includes normal word lines, spare word lines and bit lines. Space between the spare word lines is made wider than the space between the normal word lines. Further, the space between the normal word line and the spare word line is also made wider. Thus possibility of contact defect caused by a foreign matter in the steps of manufacturing can be reduced. Further, the size of the storage node of a spare memory cell is made larger than that of the storage node of a normal memory cell. Thus capacitance of the spare memory cell can be increased. Thus possibility of defects in spare memory cells is reduced ensuring repairment.

6 Claims, 9 Drawing Sheets

SEMICONDUCTOR MEMORY DEVICE HAVING REDUNDANCY FUNCTION

BACKGROUND OF THE INVENTION

1. Field of the Invention

The present invention relates to a semiconductor memory device, and more specifically to a semiconductor memory device provided with a spare memory cell for replacing a defective normal memory cell.

2. Description of the Background Art

A conventional DRAM (Dynamic Random Access Memory; hereinafter referred to as a semiconductor memory device) will be described with reference to FIG. 10. As can be seen from FIG. 10, a conventional semiconductor memory device 9000 includes a plurality of normal memory cells arranged in a matrix of rows and columns, a plurality of normal word lines 91#1 to 91#4 corresponding to the rows, a plurality of bit lines 93#1 to 93#4 corresponding to the columns, spare word lines 92#1 to 92#2 which can replace normal word lines, and a plurality of spare memory cells for replacing defective normal memory cells.

The normal word line and the spare word line are connected to a row decoder 80, and set to a selected state in accordance with a row address input to an external address input terminal (not shown). Row decoder 80 includes redundancy circuit for selecting, when an input row address corresponds to defective address, a spare word line corresponding to the defective address.

Bit lines 93#1 and 93#2 are connected to a sense amplifier 82#1, and bit lines 93#3 and 93#4 are connected to a sense amplifier 82#2. Sense amplifiers 82#1 and 82#2 are connected to a column decoder 84, and set to a selected state in accordance with a column address input to an external address input terminal (not shown).

Reference characters 94#1 to 94#8 of FIG. 10 represent storage nodes of capacitors included in normal memory cells, and reference characters 99#1 to 99#4 represent storage nodes of capacitors included in spare memory cells. Reference numeral 95 denotes a source/drain region. For example, a memory cell including storage node 94#1 is selected by normal word line 91#3. Thus, stored charges are transmitted through a bit line contact 98 to bit line 93#1.

In such a structure, when the normal memory cell including storage node 94#1 is defective and an activating signal for selecting normal word line 91#3 is generated, row decoder 80 operates not to activate the normal word line but to activate spare word line 92#1. Accordingly, charges of the spare memory cell are transmitted to bit line 93#2. Sense amplifier 82#1 amplifies charges of the spare memory cell including storage node 99#1, instead of the normal memory cell including storage node 94#1. More specifically, normal word line 91#3 is replaced by spare word line 92#1, whereby the normal memory cell connected to normal word line 91#3 is replaced by spare word line 92#1, whereby the normal memory cell connected to normal word line 91#3 is replaced by spare memory cell connected to spare word line 92#1.

In the conventional semiconductor memory device, the normal word lines and spare word lines are the same structure, and normal memory cells and spare memory cells are manufactured to have the same size.

Therefore, normal memory cells as well as spare memory cells may possibly be defective.

When the spare memory cell does not normally function because of the defect, however, a defective normal memory cell, if any, cannot be repaired. Therefore, it is desired that the possibility of defects in the spare memory cell is lower than in the normal memory cell.

SUMMARY OF THE INVENTION

An object of the present invention is to provide a semiconductor memory device in which possibility of defect in the spare memory cell is reduced, for ensuring repairment.

According to an aspect of the present invention, the semiconductor memory device includes a plurality of normal memory cells arranged in a matrix of rows and columns, a plurality of normal word lines provided corresponding to the rows of the plurality of normal memory cells, a plurality of spare memory cells arranged in a matrix of rows and columns for replacing a defective normal memory cell among said plurality of normal memory cells, and a plurality of spare word lines provided corresponding to the rows of the plurality of spare memory cells, wherein the spare word lines are respectively arranged such that minimum space between the spare word lines is made wider than minimum space between the plurality of normal word lines.

Preferably, the plurality of spare word lines are respectively arranged such that minimum space between the plurality of spare word lines and the plurality of normal word lines is wider than minimum space between the plurality of normal word lines.

Preferably, the plurality of normal memory cells each include a first memory cell capacitor and a first memory cell transistor which is rendered conductive by the corresponding normal word line, and the plurality of spare memory cells each include a second memory cell capacitor having larger capacitance than the capacitance of the first memory cell capacitor, and a second memory cell transistor which is rendered conductive by the corresponding spare word line.

Preferably, the plurality of spare memory cells are arranged such that minimum distance between the plurality of spare memory cells and the plurality of normal memory cells is longer than minimum distance between the plurality of normal memory cells.

Preferably, the plurality of spare memory cells are arranged such that minimum distance between the plurality of spare memory cells is longer than minimum distance between the plurality of normal memory cells.

Therefore, in the semiconductor memory device described above, the space between the spare word lines is made wider than the space between the normal word lines, so that the possibility of contact defect caused by a foreign matter between spare word lines can be reduced. Therefore, it becomes possible to surely repair the defective normal memory cell and to improve production yield of the semiconductor memory device.

Further, as the space between a normal word line and a spare word line is made wider than the space between normal word lines, possibility of contact defect caused by a foreign matter between the normal word line and the spare word line can be reduced.

As the storage nodes in the spare memory cells are widened, pause refresh characteristic of the spare memory cell can be improved. Further, as the distance between a normal memory cell and a spare memory cell is made longer than the distance between normal memory cells, possibility of contact defect caused by a foreign matter between the normal memory cell and the spare memory cell can be reduced.

Further, as the distance between spare memory cells is made longer than the distance between normal memory cells, possibility of contact defect caused by a foreign matter between spare memory cells can be reduced.

According to another aspect of the present invention, the semiconductor memory device includes a memory cell forming region in which a plurality of normal memory cells arranged in a matrix of rows and columns and a plurality of spare memory cells for replacing a defective normal memory cell among the plurality of normal memory cells are formed, and a dummy forming region formed at an outermost periphery of the memory cell forming region, wherein the plurality of normal memory cells each include a first memory cell transistor and a first memory cell capacitor, and the plurality of spare memory cells each include a second memory cell transistor and a second memory cell capacitor having larger capacitance than the first memory cell capacitor, formed to extend to the dummy forming region.

Preferably, the dummy forming region includes a region where a dummy cell is formed and a region where a dummy interconnection is formed, and the second memory cell capacitor includes a storage node extending in a direction of active region of the dummy cell and a cell plate provided corresponding to the storage node.

Therefore, in the semiconductor memory device described above, the spare memory cell is extended to the dummy forming region. Thus, capacitance of the spare memory cell is made larger than that of the normal memory cell. Therefore, when replacement by the spare memory cell is necessitated because of defective pause refresh characteristic of a normal memory cell, the pause refresh characteristic can be improved by the replacement.

According to a still further aspect, the semiconductor memory device includes a normal block band including a normal memory block and a sense amplifier block arranged corresponding to the normal memory block, and a spare block band including a spare memory block and a sense amplifier block arranged corresponding to the spare memory block, formed in a region different from the normal block band, wherein the normal memory block includes a plurality of normal memory cells arranged in a matrix of rows and columns and a plurality of normal word lines provided corresponding to the rows of the plurality of normal memory cells, and the spare memory block includes a plurality of spare memory cells different in shape from the plurality of normal memory cells, arranged in a matrix of rows and columns for replacing a defective normal memory cell among the plurality of normal memory cells, and a plurality of spare word lines provided corresponding to the rows of the plurality of spare memory cells at a space different from the space between the plurality of normal word lines.

Preferably, the plurality of spare word lines are arranged such that minimum space between the plurality of spare word lines is made wider than minimum space between the plurality of normal word lines.

Preferably, the plurality of space word lines are arranged such that minimum space between the plurality of normal word lines and the plurality of spare word lines is made wider than minimum space between the plurality of normal word lines.

Preferably, the plurality of normal memory cells each include a first memory cell capacitor and a first memory cell transistor which is rendered conductive by the corresponding normal word line, and the plurality of space memory cells each include a second memory cell capacitor having larger capacitance than that of the first memory cell capacitor, and a second memory cell transistor which is rendered conductive by the corresponding spare word line.

Preferably, the plurality of spare memory cells are arranged such that minimum distance between the plurality of spare memory cells and the plurality of normal memory cells is made longer than minimum distance between the plurality of normal memory cells.

Preferably, the plurality of spare memory cells are arranged such that minimum distance between the plurality of spare memory cells is longer than minimum distance between the plurality of normal memory cells.

Preferably, a row decoder for selecting a corresponding row in accordance with an external address is further provided, and each of the plurality of normal word lines included in the normal memory block and each of the plurality of spare word lines included in the spare memory block are set to the selected state by the row decoder.

Preferably, a plurality of bit lines arranged in the direction of the columns of the normal memory block and the spare memory block, and a column decoder for selecting a corresponding column of the normal memory block and the spare memory block in accordance with an external address are further provided.

In the semiconductor memory device described above, the normal memory cell block and the spare memory cell block of different structures are arranged in different regions. Therefore, it becomes possible to so form the spare memory cell region as to reduce the possibility of defects in the spare memory cells. Therefore, it becomes possible to surely repair a defective normal memory cell and to improve production yield of the semiconductor memory device.

Further, as the space between the spare word lines is made wider than the space between the normal word lines, possibility of contact defect caused by a foreign matter between a spare word lines can be reduced.

Further, as the space between a spare word line and a normal word line is made wider than the space between the normal word lines, possibility of contact defect caused by a foreign matter between the spare word line and the normal word line can be reduced.

Further, as the storage nodes in the spare memory cells are widened, pause refresh characteristic of the spare memory cell can be improved.

Further, as the distance between a normal memory cell and a spare memory cell is made longer than the distance between normal memory cells, possibility of contact defect caused by a foreign matter between the normal memory cell and spare memory cell can be reduced.

Further, as the distance between the between spare memory cells is made longer that the distance between the normal cells, possibility of contact defect caused by a foreign matter between spare memory cells can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
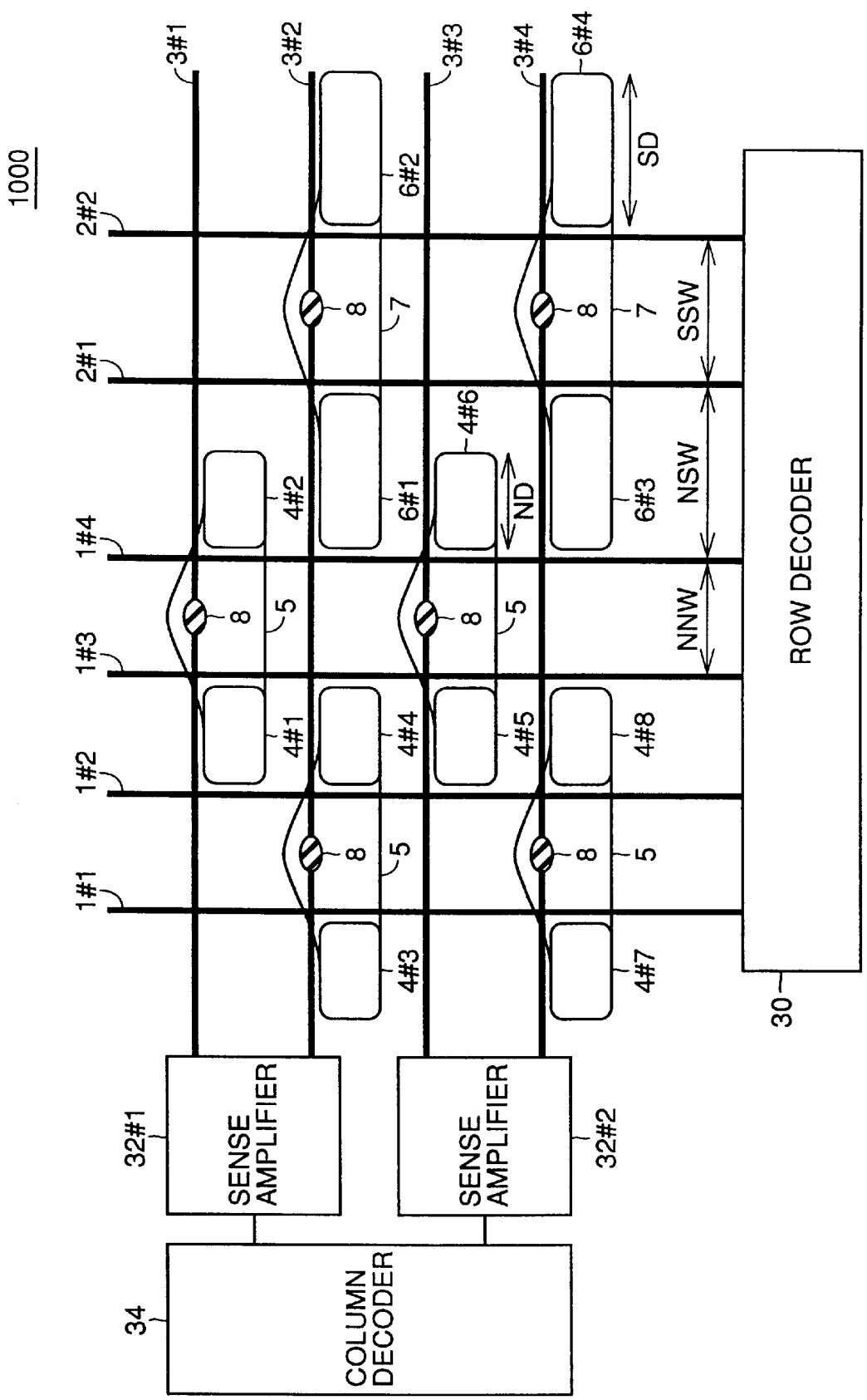
FIG. 1 is a block diagram representing a configuration of a semiconductor memory device 1000 in accordance with a first embodiment of the present invention.

An embodiment of the present invention will be described in detail with reference to the figures, in which corresponding elements are denoted by the same reference characters or same reference numerals, and description thereof is not repeated.

First Embodiment

A semiconductor memory device 1000 in accordance with the first embodiment of the present invention will be described with reference to FIG. 1.

As can be seen from FIG. 1, semiconductor memory device 1000 includes a plurality of memory cells arranged in a matrix of rows and columns, a plurality of normal word lines 1#1 to 1#4 corresponding to the rows, a plurality of bit lines 3#1 to 3#4 corresponding to the columns, a plurality of spare memory cells for replacing a normal memory cell, spare word lines 2#1 to 2#2 replaceable with normal word lines, a row decoder 30, sense amplifiers 32#1 to 32#2 and a column decoder 34.

A word line (generally representing normal word lines and spare word lines) is connected to row decoder 30. Row decoder 30 receives a row address input to an external address input terminal, not shown, and selects (activates) a corresponding normal word line. Row decoder 30 includes a redundancy circuit, not shown. When the input row address corresponds to a defective address, the redundancy circuit selects a spare word line, in place of the normal word line of the corresponding defective address.

Bit lines 3#1 and 3#2 are connected to sense amplifier 32#1, and bit lines 3#3 and 3#4 are connected to sense amplifier 32#2. Sense amplifiers 32#1 and 32#2 are connected to column decoder 34, and selected in accordance with a column address input to an external address input terminal (not shown).

Figure 2:
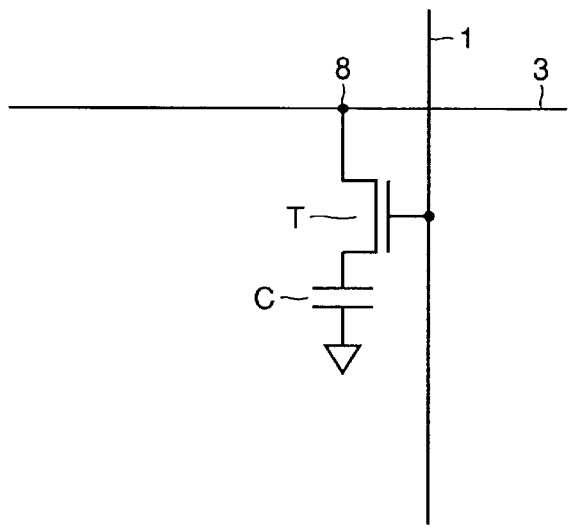
FIG. 2 is a circuit diagram representing a memory cell configuration.

A memory cell (generally representing normal memory cells and spare memory cells) includes a memory cell capacitor C storing information in the form of charges, and a memory cell transistor T which is rendered conductive in response to potential of a corresponding word line, and connecting the corresponding bit line to memory cell capacitor C, as shown in FIG. 2.

Figure 3:
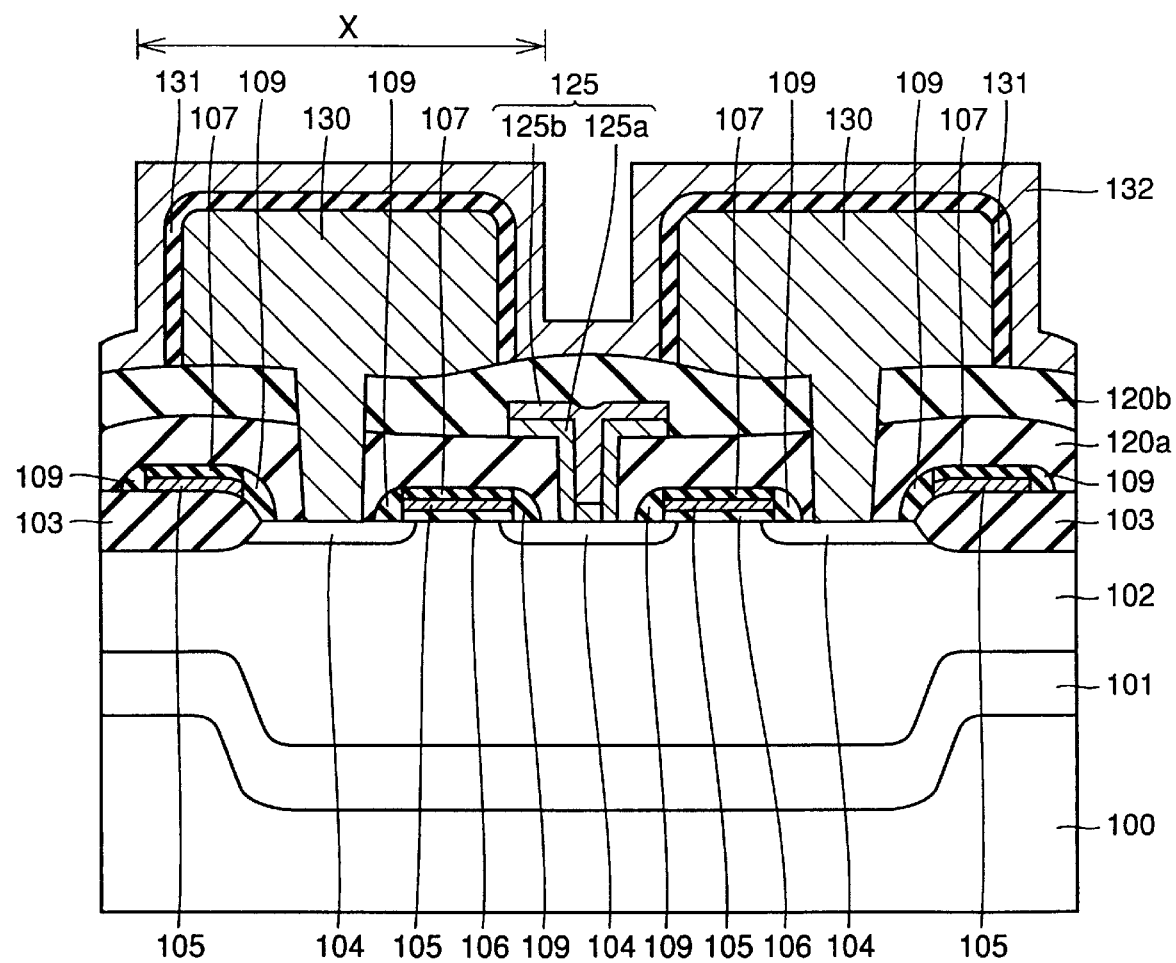
FIG. 3 is a cross section representing a structure of the memory cell.

FIG. 3 is a cross section of a memory cell region. Referring to FIG. 3, on a surface of a semiconductor substrate formed of a silicon substrate 100, an impurity region 101 and a well 102, impurity regions (source/drain regions) 104 and element isolating insulating layers 103 are formed at a prescribed distance. Memory cells are formed on the surface of such a substrate. As described above, a memory cell consists of a memory cell transistor and a memory cell capacitor.

The memory cell transistor consists of a pair of source/drain regions formed at a prescribed space at the surface of the substrate, and a gate 105. Gate 105 is formed on that region which is between the source/drain regions, with a gate oxide film 106 interposed. An insulating film 107 is formed on the gate, and sidewall insulating films 109 are formed to cover sidewalls of the gate.

An interlayer insulation film 120a is formed to cover the memory cell transistor. A bit line 125 (125a, 125b) is formed on interlayer insulating film 120a to be electrically connected to one of the pair of source/drain regions of the memory transistor. An interlayer insulating film 120b is formed to cover bit line 125.

A memory cell capacitor is formed on interlayer insulating film 120b. The memory cell capacitor has a storage node 130 and a cell plate 132 opposing to storage node 130 with a dielectric 131 interposed. Referring to the figure, the reference character X represents length of the memory cell in a direction vertical to the word line. In the first embodiment of the present invention, the length X differs in normal memory cell and a spare memory cell.

In FIG. 1, reference characters 4#1 to 4#8 represent storage nodes of the normal memory cell, and reference characters 6#1 to 6#4 represent storage nodes of the spare memory cell, respectively. Reference numerals 5 and 7 represent source/drain regions.

Referring to FIG. 1, when normal word line 1#1 is selected, charges stored in the memory cell capacitor having storage node 4#3 are transmitted to bit line 3#2 through the corresponding bit line contact 8. When normal word line 1#2 is selected, charges stored in the memory cell capacitor having storage node 4#4 are transmitted to bit line 3#2 through the corresponding bit line contact 8.

When spare word line 2#1 is selected, charges stored in the memory cell capacitor having storage node 6#1 are transmitted to bit line 3#2 through the corresponding bit line contact 8. When spare word line 2#2 is selected, charges stored in the memory cell capacitor having storage node 6#2 are transmitted to bit line 3#2 through the corresponding bit line contact 8.

In such a structure, when the memory cell including storage node 4#1 is defective and an activating signal selecting normal word line 1#3 is generated, for example, row decoder 30 operates not to activate the normal word line but to activate the corresponding spare word line 2#1. Consequently, charges of the spare memory cell are transmitted to bit line 3#2. Sense amplifier 32#1 amplifies the charges of the spare memory cell including storage node 6#1, in place of the normal memory cell including storage node 4#1. More specifically, by substituting spare word line 2#1 for normal word line 1#3, the normal memory cell connected to normal word line 1#3 is replaced by the spare memory cell connected to spare word line 2#1.

The structure of semiconductor memory device 1000 in accordance with the first embodiment of the present invention will be described. In FIG. 1, reference character NNW represents minimum space between normal word lines (for example, between normal word lines 1#1 and 1#2, between normal word lines 1#2 and 1#3, and between normal word lines 1#3 and 1#4). The reference character NSW represents minimum space between a normal word line and a spare word line (for example, between normal word line 1#4 and spare word line 2#1). Reference character SSW represents minimum space between spare word lines (for example, between spare word lines 2#1 and 2#2).

In the figure, reference characters ND and SD represent the length of the storage node in a normal memory cell in the direction orthogonal to the word line, and the length of the storage node in a spare memory cell in the direction orthogonal to the word line, respectively.

In the semiconductor memory device 1000 in accordance with the first embodiment of the present invention, the spare word lines are arranged such that minimum space NSW between the normal word line and the spare word line is wider than the minimum space NNW between the normal word lines. Further, the spare word lines are arranged such that minimum space SSW between the spare word lines is wider than the minimum space NNW between the normal word lines. Namely, the following relations are satisfied: NSW>NNW and SSW>NNW.

Accordingly, the size of storage nodes 6#1 to 6#4 constituting the spare memory cells is made larger than the size of the storage nodes 4#1 to 4#8 constituting the normal memory cells. More specifically, the spare memory cells are formed to satisfy the relation of SD>ND where ND represents the length of the storage node of a normal memory cell and SD represents the length of the storage node in a spare memory cell (in the cross section of FIG. 3, the length X of the storage node differs in a normal memory cell and a spare memory cell).

The structure in the storage node in the direction of the word line is made the same both in the normal memory cell and the spare memory cell. Therefore, when the capacitance of the normal memory cell is represented as C and the capacitance of the spare memory cell as CS, the relation of CS≈C holds in the prior art, while in the first embodiment of the present invention, the relation of CS>C holds.

By widening the space NSW between a spare word line and a normal word line, possibility of contact defect caused by a foreign matter during the steps of manufacturing can be reduced. Further, as the space SSW between the spare word lines is made wider than the normal word line space NNW, possibility of contact of spare word lines to each other by a foreign matter can be reduced. In other words, the possibility of defects in the spare word lines can be reduced.

Further, as the capacitance of the spare memory cell is made larger than the capacitance of the normal memory cell, when replacement by the spare memory cell is necessitated by defective pause refresh characteristic of a normal memory cell, the pause refresh characteristic can be improved by the replacement.

Therefore, by the structure in accordance with the first embodiment of the present invention, possibility of a defect of a spare memory cell can be reduced, and therefore a defective memory cell can more surely be repaired as compared with the prior art structure. Therefore, production yield of the semiconductor memory device such as the DRAM can be improved.

Second Embodiment

Figure 4:
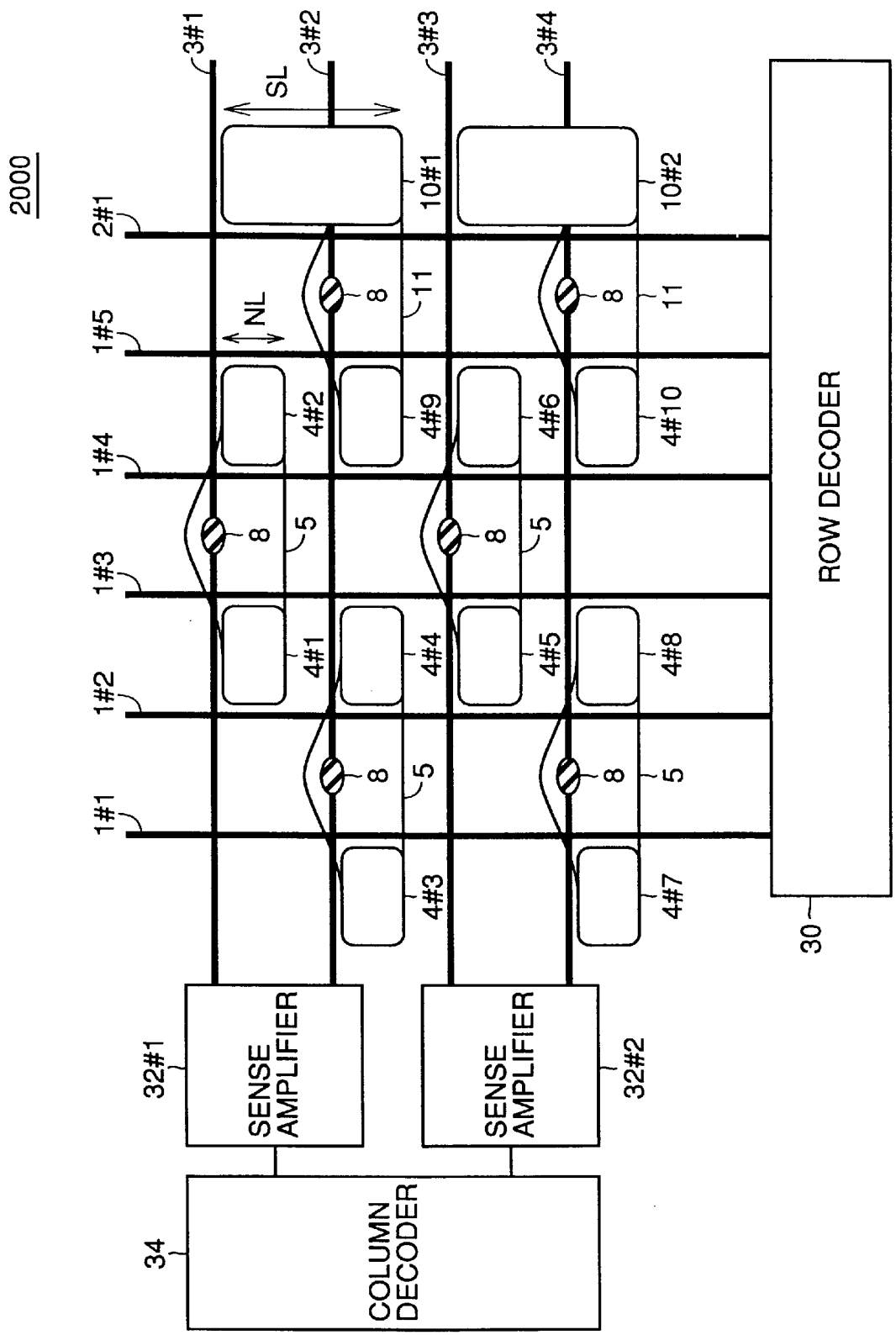
FIG. 4 is a block diagram representing a semiconductor memory device 2000 in accordance with a second embodiment of the present invention.

A semiconductor memory device 2000 in accordance with the second embodiment of the present invention will be described with reference to FIG. 4. In FIG. 4, reference characters 1#1 to 1#5 represent normal word lines corresponding to normal memory cells, reference characters 4#1 to 4#10 represent storage nodes of the normal memory cells, reference character 2#1 represents a spare word line, reference characters 10#1 to 10#2 represent storage nodes of spare memory cells, and reference characters 3#1 to 3#4 represent bit lines, respectively. Reference numerals 5 and 11 represent source/drain regions.

Figure 5:
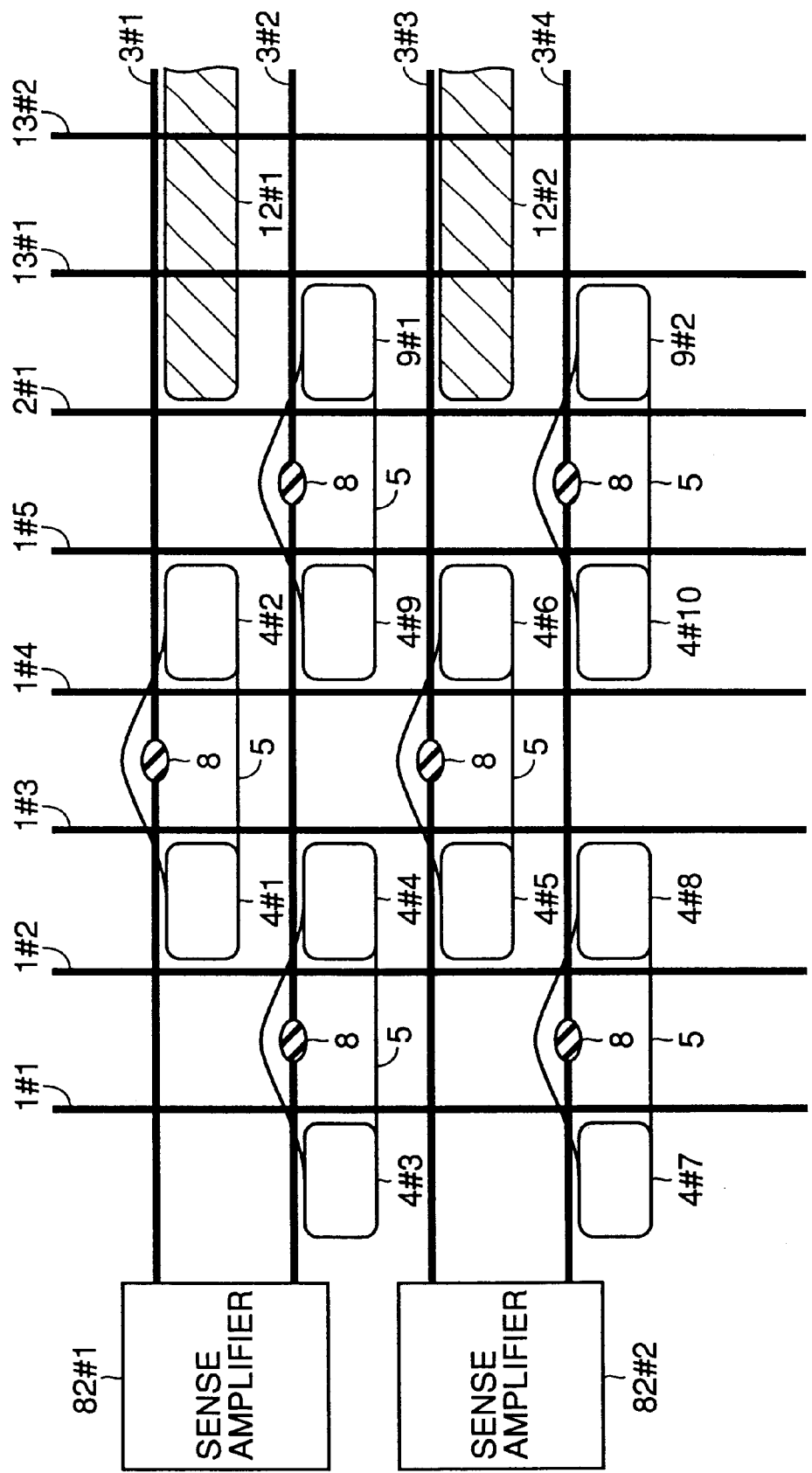
FIG. 5 represents relation between the dummy region and the spare memory cell.

Generally, as can be seen from FIG. 5, at an outermost peripheral portion of the normal memory cell region, there is a dummy forming region in which dummy cells and dummy interconnections not related to the operation of the circuitry are formed. In the figure, reference characters 12#1 and 12#2 represent regions where dummy cells are formed, and reference characters 13#1 and 13#2 represent dummy interconnections. Reference characters 9#1 and 9#2 represent storage nodes of the spare memory cells.

By contrast, in accordance with the second embodiment of the present invention, the storage nodes constituted the spare memory cells are extended in the direction of the dummy forming region, as shown in FIG. 4. For example, the storage node is extended in the direction of the active region of the dummy cell as shown in figure.

In the figure, the reference character NL represents the length of the storage node of a normal memory cell along the word line, and SL represents the length of the storage node in a spare memory cell along the word line, respectively.

For example, the spare memory cells are formed to satisfy the relation SL>NL, where NL represents the length of the storage node in a normal memory cell in the direction along the word line and SL represents the length of the storage node in a spare memory cell in the direction along the word line.

Accordingly, the capacitance of the spare memory cell comes to be larger than the capacitance of the normal memory cell. As a result, when replacement by the spare memory cell is necessitated by a defective pause refresh characteristic of a normal memory cell, the pause refresh characteristic can be improved by the replacement.

Therefore, by the structure in accordance with the second embodiment of the present invention, possibility of pause refresh defect in the spare memory cell can be reduced, and hence a memory cell defective in pause refresh can more surely be replaced as compared with the conventional structure. Thus production yield of the semiconductor memory device such as DRAM can be improved.

Third Embodiment

Figure 6:
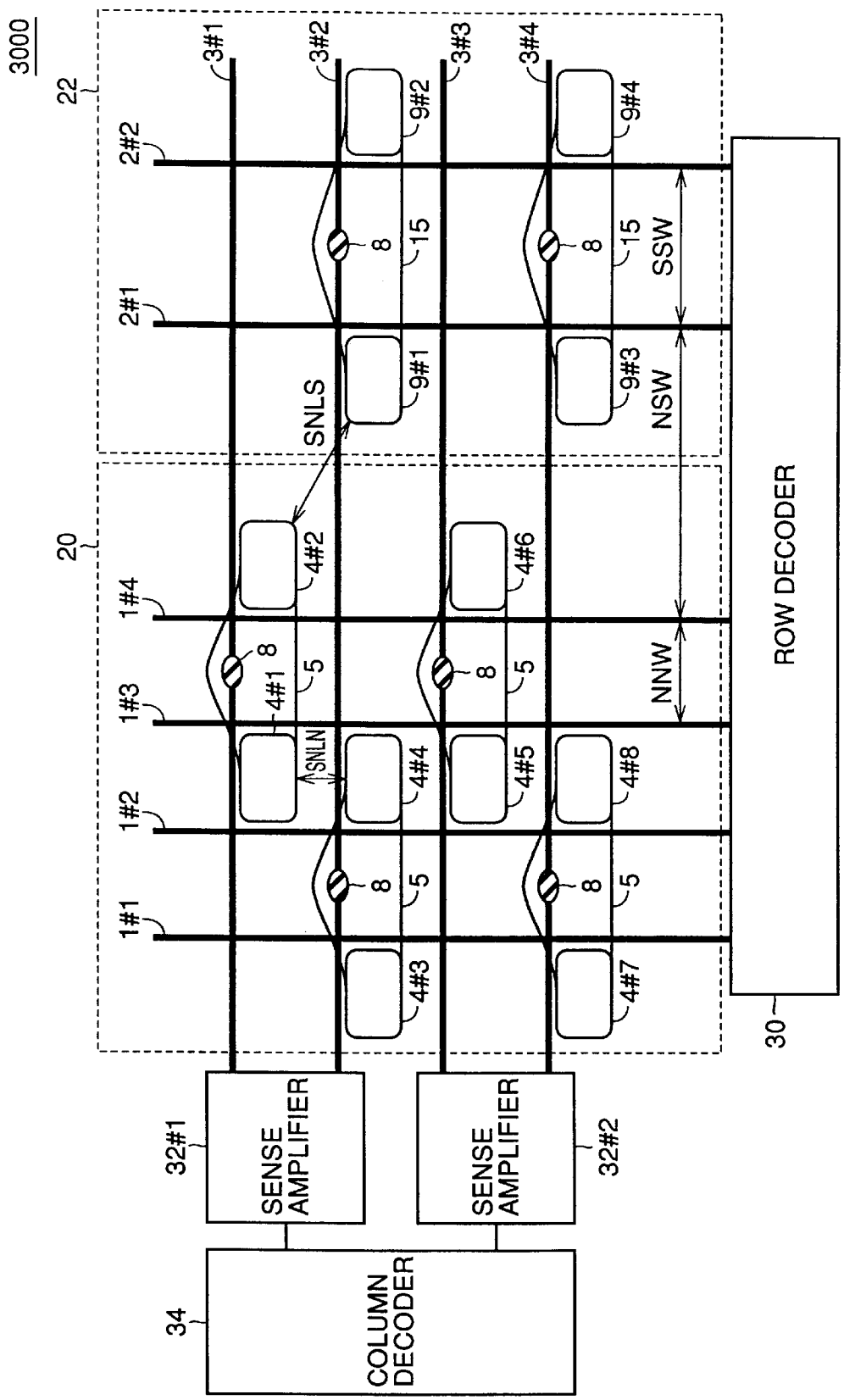
FIG. 6 is a block diagram representing a semiconductor memory device 3000 in accordance with a third embodiment of the present invention.

A semiconductor memory device 3000 in accordance with the third embodiment of the present invention will be described with reference to FIG. 6. In FIG. 6, reference characters 1#1 to 1#4 represent normal word lines corresponding to normal memory cells, reference characters 4#1 to 4#8 represent storage nodes of the normal memory cells, reference characters 2#1 and 2#2 represent spare word lines, reference characters 9#1 to 9#4 represent storage nodes of the spare memory cells, and reference characters 3#1 to 3#4 represent bit lines, respectively. Reference numerals 5 and 15 represent source/drain regions.

A region 20 shown in FIG. 6 represents a normal memory cell block including normal word lines 1#1 to 1#4 and normal memory cells (storage nodes 4#1 to 4#8) activated by the normal word lines. A region 22 represents a spare memory cell block including spare word lines 2#1 and 2#2 and spare memory cells (storage nodes 9#1 to 9#4) activated by the spare word lines.

In the figure, reference characters SNLN represents minimum distance between normal memory cells (for example, between normal memory cell 4#1 and normal memory cell 4#4) and SNLS represents minimum distance between a spare memory cell and a normal memory cell (for example, between normal memory cell 4#2 and spare memory cell 9#1) or minimum distance between spare memory cells (for example, between spare memory cell 9#1 and spare memory cell 9#3).

In semiconductor memory device 3000 in accordance with the third embodiment of the present invention, the spare memory cells are arranged such that minimum distance between a spare memory cell and a normal memory cell, or minimum distance between the spare memory cells, is longer than the minimum distance between the normal memory cells.

More specifically, the relation of SNLS>SNLN is satisfied, where SNLN represents minimum distance between the normal memory cells and SNLS represents minimum distance between a normal memory cell and spare memory cell or between spare memory cells.

Further, the spare word lines are arranged to satisfy the relation of NSW>NNW and SSW>NNW, where NNW represents minimum space between the normal word lines, NSW represents minimum space between the normal word line and the spare word line, and SSW represents minimum space between the spare word lines.

As the minimum distance between a space memory cell and a memory cell (spare memory cell or normal memory cell) is made longer than the minimum distance between the normal memory cells, possibility of contact defect caused by a foreign matter of a spare memory cell and another memory cell during the steps of manufacturing can be reduced.

For example, when the space between storage node 9#1 of a spare memory cell and storage node 4#2 or 9#3 of an adjacent memory cell is made wider, the possibility of contact between storage node 9#1 of the spare memory cell and the adjacent memory cell can be made lower than the possibility of contact between normal memory cells.

Therefore, by the structure in accordance with the third embodiment of the present invention, a defective memory cell can more surely be repaired. Thus production yield of the semiconductor memory device such as the DRAM can be improved.

Fourth Embodiment

A semiconductor memory device 4000 in accordance with the fourth embodiment of the present invention will be described with reference to FIGS. 7 to 9.

Figure 7:
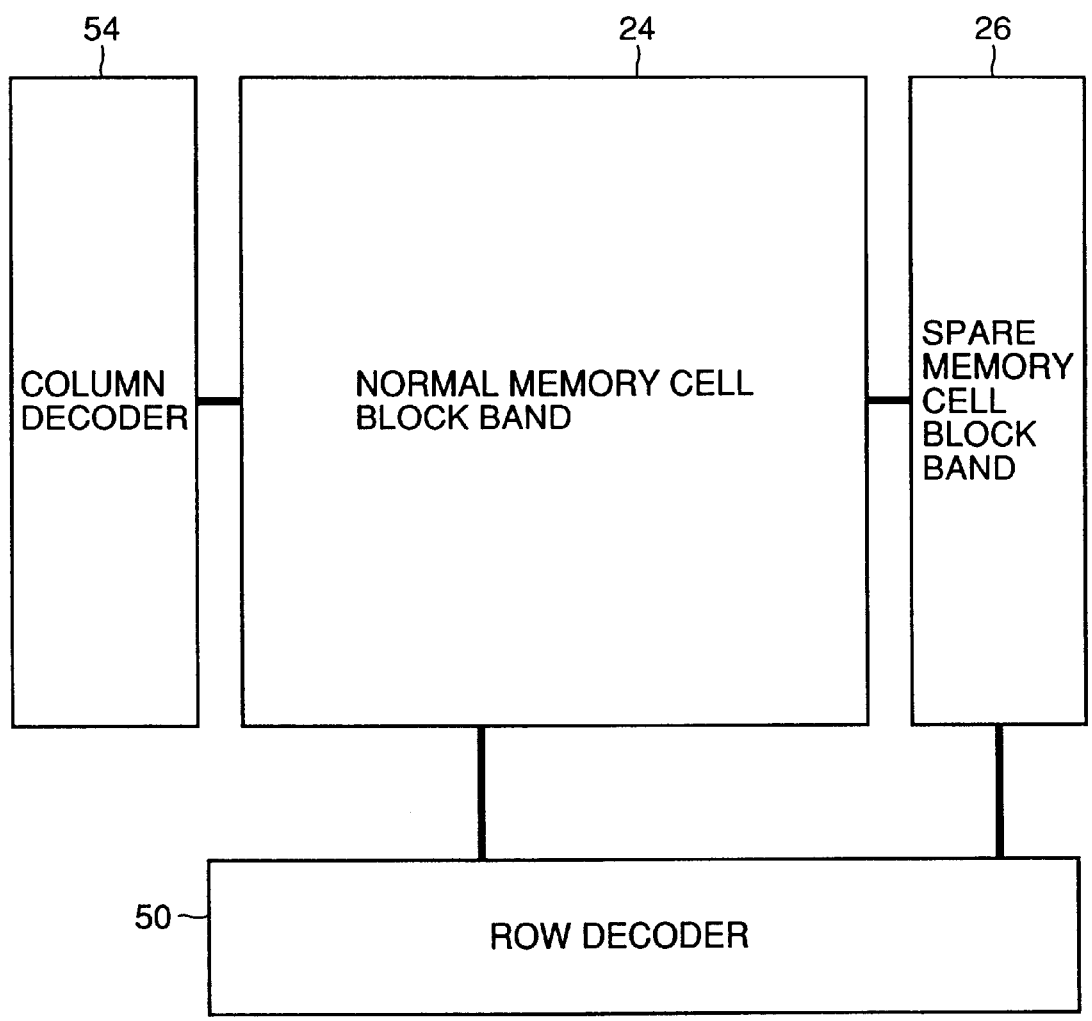
FIG. 7 is a block diagram representing a semiconductor memory device 4000 in accordance with a fourth embodiment of the present invention.
Figure 8:
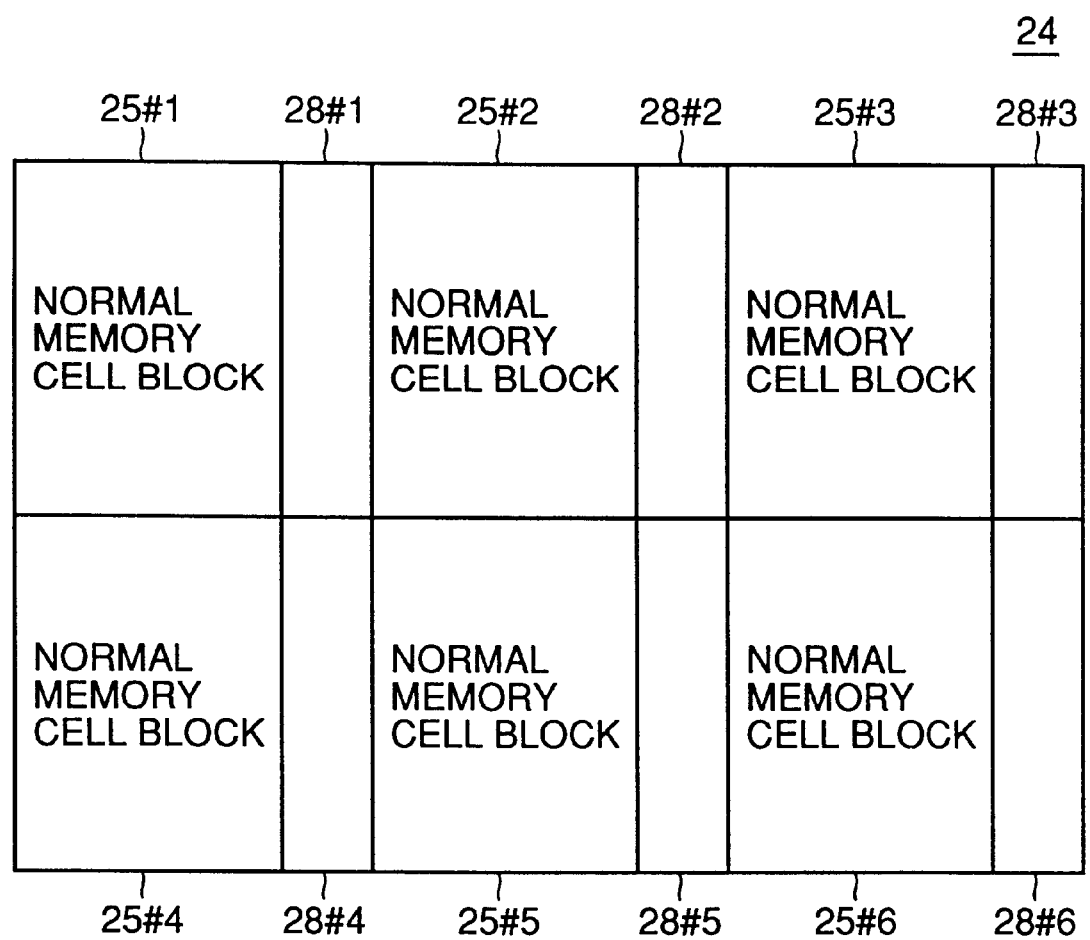
FIG. 8 is a block diagram representing a configuration of a normal memory cell block band 24.
Figure 9:
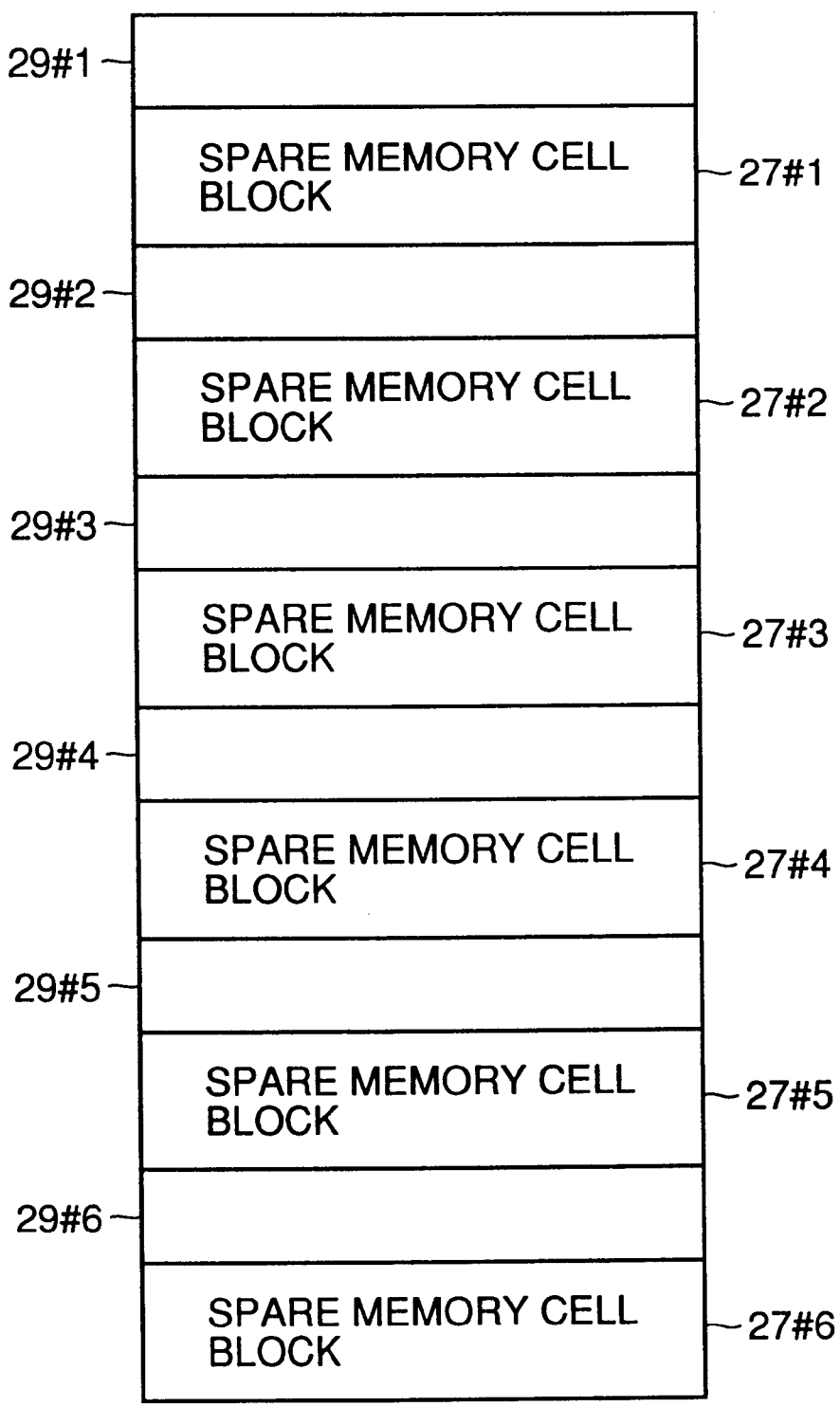
FIG. 9 is a block diagram representing a configuration of a spare memory cell block band 26.
Figure 10:
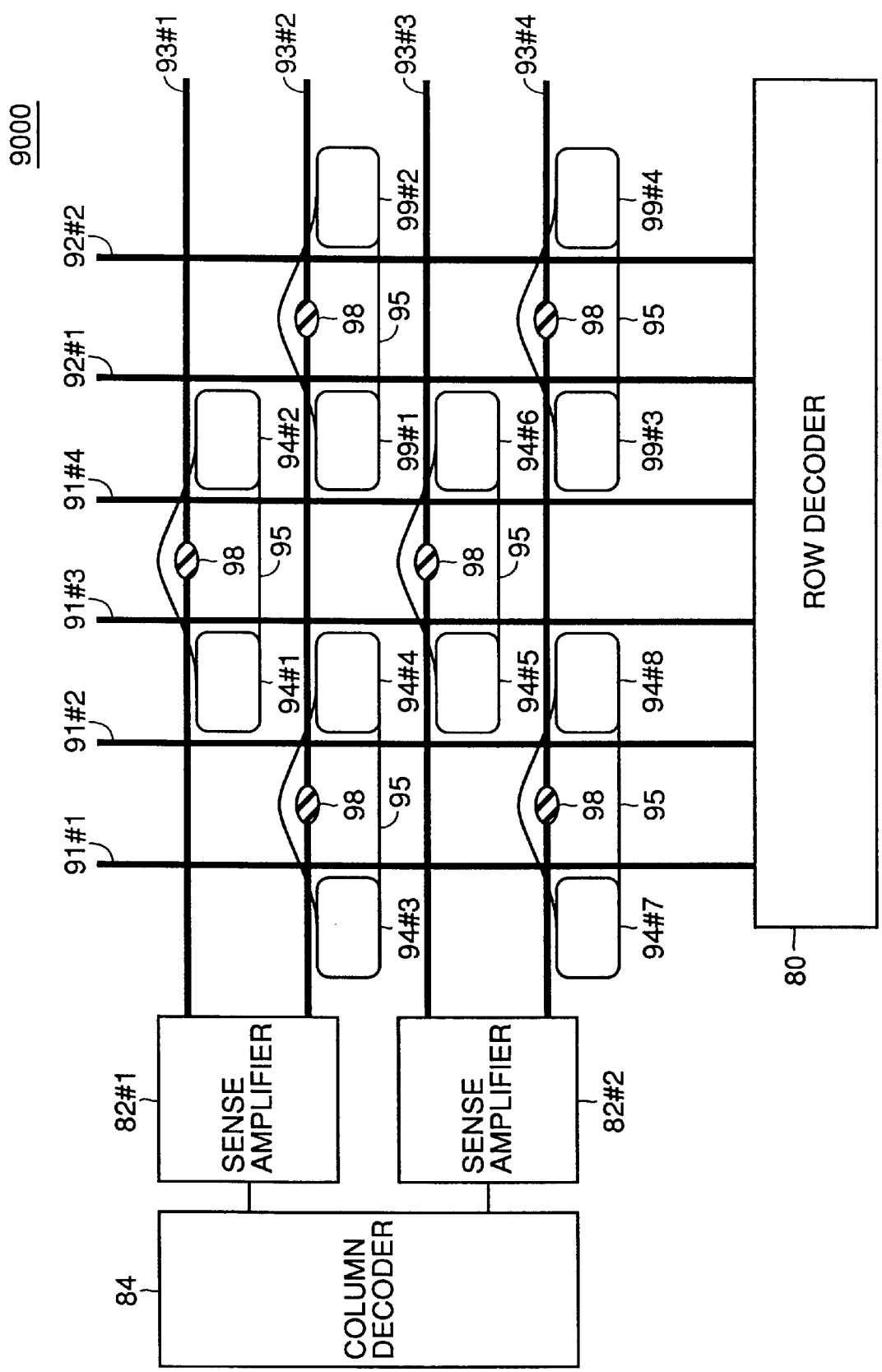
FIG. 10 is a block diagram representing a conventional semiconductor memory device 9000.

Referring to FIGS. 7 to 9, semiconductor memory device 4000 includes a normal memory cell block band 24, a spare memory cell block band 26, a row decoder 50 and a column decoder 54.

Normal memory cell block band 24 includes a plurality of normal memory cell blocks and a plurality of sense amplifier blocks. In FIG. 8, normal memory cell blocks 25#1 to 25#6 and sense amplifier blocks 28#1 to 28#6 corresponding to normal memory cell blocks 25#1 to 25#6, respectively, are shown as representatives.

Normal memory cell blocks 25#1 to 25#6 each include normal word lines and normal memory cells. Sense amplifier blocks 28#1 to 28#6 each include a plurality of sense amplifiers 4#1 (4#2) described above.

Spare memory cell block band 26 includes a plurality of spare memory cell blocks and a plurality of sense amplifier blocks. In FIG. 9, spare memory cell blocks 27#1 to 27#6 and sense amplifier blocks 29#1 to 29#6 corresponding to spare memory cell blocks 27#1 to 27#6, respectively, are shown as representatives.

Spare memory cell blocks 27#1 to 27#6 each include a spare word line and a spare memory cell. Sense amplifier blocks 29#1 to 29#6 each include a plurality of sense amplifiers 4#1 (4#2) described above.

The normal memory cell blocks and the spare memory cell blocks each have the structure as described in the embodiments above.

More specifically, minimum space NSW between a normal word line and a spare word line is made wider than minimum space NNW between normal word lines (NSW>NNW). Minimum space SSW between the spare word lines is made wider than the minimum space NNW between the normal word lines (SSW>NNW). The length SD of the storage node in a spare memory cell is made longer than the length ND of the storage node in a normal memory cell (SD>ND).

Alternatively, the minimum distance SNLS between a spare memory cell and a normal memory cell or between the spare memory cells is made longer than the minimum distance SNLN between the normal memory cells (SNLS>SNLN).

For example, when the spare memory cell block having such a spare memory cell structure or the spare word line arrangement described with respect to the first or third embodiment is arranged at an end of the normal memory cell block, the space between the word lines, size of the memory cells (storage nodes) and the space between the memory cells differ from the normal memory cell block to the spare memory cell block, and therefore periodicity of patterns changes at the interface between the two blocks. Thus it becomes difficult to manufacture word lines and memory cells of the desired shape, possibly lowering production yield in the steps of manufacturing.

Therefore, in the fourth embodiment of the present invention, the spare memory cell block and the normal memory cell block are not arranged in one memory block, and rather, the normal memory cell block band including the normal memory cell blocks only, and the spare memory cell block band including the spare memory cell blocks only are arranged in separate regions.

As a method of arrangement, within the range of memory cells selectable by column decoder 54, spare memory cell blocks are arranged concentrated on one portion, different from the position of the normal memory cell blocks. Alternatively, within the range of memory cells selectable by row decoder 50, the spare memory cell blocks may be arranged concentrated on one portion at a position different from the normal memory cell blocks.

By this configuration, it becomes possible to provide spare memory cell blocks such that possibility of defect in the spare memory cells is reduced. Further, as the spare memory cell block band is at a different position from the normal memory cell block band, lowering of production yield during the steps of manufacturing can be prevented.

Therefore, a defective normal memory cell can more surely be repaired as compared with the prior art, and production yield of the semiconductor memory device such as the DRAM can be improved.

Though a spare column in which replacement or substitution is performed word line by word line has been described, the present invention is applicable to a spare column (in a normal memory cell block band including a plurality of normal memory cell blocks selectable by row decoder 50 (replacement or substitution bit line by bit line), and by the similar structure, possibility of repairment is improved, and production yield can also be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   plurality of normal memory cells arranged in a matrix of rows and columns;
   a plurality of normal word lines provided corresponding to the rows of said plurality of normal memory cells;
   a plurality of spare memory cells arranged in a matrix of rows and columns for replacing a defective normal memory cell among said plurality of normal memory cells; and a plurality of spare word lines provided corresponding to the rows of said plurality of spare memory cells; wherein said plurality of spare word lines are arranged such that minimum space between said plurality of spare word lines is made wider than minimum space between said plurality of normal word lines.

2. The semiconductor memory device according to claim 1, wherein said plurality of spare word lines are arranged such that minimum space between said plurality of spare word lines and said plurality of normal word lines is made wider than minimum space between said plurality of normal word lines.

3. The semiconductor memory device according to claim 1, wherein each of said plurality of normal memory cells includes a first memory cell capacitor, and a first memory cell transistor rendered conductive by corresponding normal word line; and each of said plurality of spare memory cells includes a second memory cell capacitor having larger capacitance than said first memory cell capacitor, and a second memory cell transistor rendered conductive by corresponding spare word line.

4. The semiconductor memory device according to claim 2, wherein each of said plurality of normal memory cells includes a first memory cell capacitor, and a first memory cell transistor rendered conductive by corresponding normal word line; and each of said plurality of spare memory cells includes a second memory cell capacitor having larger capacitance than said first memory cell capacitor, and a second memory cell transistor rendered conductive by corresponding spare word line.

5. The semiconductor memory device according to claim 1, wherein said plurality of spare memory cells are arranged such that minimum distance between said plurality of spare memory cells and said plurality of normal memory cells is made longer than minimum distance between said plurality of normal memory cells.

6. The semiconductor memory device according to claim 1, wherein said plurality of spare memory cells are arranged such that minimum distance between said plurality of spare memory cells is made longer than minimum distance between said plurality of normal memory cells.

* * * * *